United States Patent [19]
Marsden

[11] Patent Number: 5,173,660
[45] Date of Patent: Dec. 22, 1992

[54] PACKAGED SQUID SYSTEM WITH INTEGRAL SUPERCONDUCTING SHIELDING LAYER

[75] Inventor: James R. Marsden, San Diego, Calif.

[73] Assignee: Biomagnetic Technologies, Inc., San Diego, Calif.

[21] Appl. No.: 634,067

[22] Filed: Dec. 26, 1990

[51] Int. Cl.⁵ ............................................. G01R 33/035
[52] U.S. Cl. ..................................... 324/248; 505/846
[58] Field of Search .............................. 324/244, 248; 505/841–846

[56] References Cited

U.S. PATENT DOCUMENTS

| | | | |
|---|---|---|---|
| 4,224,630 | 9/1980 | Kroger | 324/248 |
| 4,491,795 | 1/1985 | Gelinas | 324/248 |
| 4,749,946 | 6/1988 | Hoenig | 324/248 |

Primary Examiner—Gerard R. Strecker
Assistant Examiner—Warren S. Edmonds
Attorney, Agent, or Firm—Gregory Garmong

[57] ABSTRACT

A SQUID package includes a layered SQUID base and a SQUID mounted upon the base. The SQUID base is formed as a first substrate layer of an electrically insulating material, a shielding layer of a material that is superconducting at the SQUID operating temperature overlying the first substrate layer, and a second substrate layer of an electrically insulating material overlying the shielding layer. The shielding layer protects the SQUID from dc and ac interference such as magnetic and electrical fields, which would otherwise interfere with its operation. Related components such as input and output circuitry can be mounted on the base. An input coil used to detect magnetic fields can also be placed on the base, but in that case the shielding layer is made to cover only a portion of the SQUID base, and the input coil is positioned over the portion of the base that has no shielding layer.

12 Claims, 1 Drawing Sheet ic material, a shielding layer overlying the first substrate layer, the shielding layer being made of a material that is superconducting at the preselected operating temperature, and a second substrate layer overlying the shielding layer, the second substrate layer being made of an electrically insulating material; and a SQUID supported upon the SQUID base.

PACKAGED SQUID SYSTEM WITH INTEGRAL SUPERCONDUCTING SHIELDING LAYER

BACKGROUND OF THE INVENTION

This invention relates to the utilization of superconducting quantum interference devices, and, more particularly, to the packaging in which such devices are placed for service.

A Superconducting QUantum Interference Device, commonly called by the acronym "SQUID" in the art, is a very sensitive detector of small electrical currents. The SQUID can also be used as a sensitive detector of small magnetic fields by using a magnetic flux detector such as a simple loop or a gradiometer, sometimes collectively termed an "input coil" in the art, to excite a current flow in the SQUID, and then detecting that current flow with the SQUID as a measure of the magnetic field. SQUIDs operated in conjunction with an input coil are the most sensitive magnetic field detectors presently in use. As suggested by its name, the SQUID functions in a superconducting mode of operation, and therefore is normally cooled to cryogenic temperatures of 10K or less.

The human body emits weak magnetic fields that are related to its state of health. For example, the fields produced by the brain may be on the order of 1/10,000,000 of the magnitude of the earth's magnetic field, and only a device as sensitive as the SQUID can be used to detect and investigate these biomagnetic fields. SQUIDs are therefore central to the biomagnetometer, which is a medical analytical and diagnostic instrument used to measure magnetic fields produced by the brain, heart, or other parts of the body.

A typical biomagnetometer has an input coil positioned near to the portion of the body under study, and a SQUID connected to the input coil. The SQUID is located within a container cooled to its preselected temperature of superconducting operation, and the input coil is normally located within that same container. A magnetic field emitted from the body excites a current flow in the coil, which is detected by the SQUID to produce a signal that is further processed to yield an understanding of the magnetic field produced by the body, and thence of the functioning of the body.

A SQUID is so sensitive that it must be carefully shielded from any extraneous electrical or magnetic fields that might interfere with its measurement of the emitted field from the body. The magnetic field of the earth or that produced by nearby electrical equipment, for example, can completely overwhelm and mask the biomagnetic field of interest, if the SQUID is not shielded from such extraneous field. Care is therefore taken to fully shield the SQUID from such influences.

One of the most effective shielding approaches is to place a piece of superconducting material between the SQUID and sources of extraneous magnetic and electrical fields. A superconducting material not only has a low electrical resistance, but also excludes magnetic fields through a phenomenon called the Meissner effect. Since the SQUID is operated at superconducting temperatures anyway, the use of superconducting shielding poses no additional technical problems and is very effective.

In current biomagnetometers, the SQUIDs are usually enclosed within housings made of machined niobium or other superconductor, and lead-plated machined brass. These housings are effective in shielding the SQUIDs from external magnetic and electrical fields, but are also expensive to manufacture and repair.

Accordingly, there is a need for improved shielding techniques which are effective, and also less costly than existing approaches. The present invention fulfills this need, and further provides related advantages.

SUMMARY OF THE INVENTION

The present invention provides a packaging structure that supports a SQUID, and its associated electronics and even the input coil, and also shields the SQUID from extraneous external electrical and magnetic fields. The packaging is relatively inexpensive to produce, and is fully effective in its shielding function. The packaged SQUID subassembly is readily handled and incorporated into larger assemblies such as a biomagnetometer dewar.

In accordance with the invention, a packaged SQUID system operable at a preselected operating temperature comprises a layered SQUID base, including a first substrate layer made of an electrically insulating material, a shielding layer overlying the first substrate layer, the shielding layer being made of a material that is superconducting at the preselected operating temperature, and a second substrate layer overlying the shielding layer, the second substrate layer being made of an electrically insulating material; and a SQUID supported upon the SQUID base.

The SQUID base of the packaged SQUID system is formed in a layered manner similar to that used for printed wiring boards, as layers of fiber-epoxy composite and metal. The fabrication technology and equipment to manufacture the SQUID base are usually readily available to those who would use the approach of the invention for SQUID packaging.

The SQUID base is prepared by furnishing or depositing the first substrate layer of an electrically nonconducting material, then depositing a layer of a shielding material overlying at least a part of the first substrate layer. The shielding material must be superconducting at the preselected SQUID operating temperature, and it is therefore preferable to make the shielding layer from the same material as used to fabricate the active current paths of the SQUID. A second substrate layer of electrically nonconducting material is deposited over the shielding layer to protect it and to isolate overlying components from the superconducting layer.

In the presently most preferred embodiment, the SQUID current paths and the superconducting shielding layer are made of niobium, which becomes superconducting at temperatures below about 9.2K. The preselected operating temperature is usually 4.2K or below, as this temperature can be reached by immersing the SQUID in liquid helium, which has a boiling point of 4.2K at 1 atmosphere pressure. The present technique of SQUID packaging is also operable for SQUIDs having a preselected operating temperature that is higher, and in particular is operable for SQUIDs made of high $T_c$ superconductors having a transition temperature above 77K. However, for the most demanding applications it is still preferable to operate the SQUID at very low temperatures such as 4.2K or below, to suppress electrical noise.

The SQUID is then supported on the SQUID base. The SQUID is preferably fabricated separately and then affixed to the upper surface of the SQUID base, or in some cases it may be possible to fabricate the SQUID integrally with the SQUID base by microelectronic techniques. The former is preferred, because the SQUID is preferably separated some distance from the shielding layer in order to reduce capacitance to the shielding layer. Also, the self inductance of the SQUID is significantly reduced if it is too close to the shielding layer. It may be difficult to sufficiently separate the SQUID from the shielding layer if the entire device is fabricated integrally by microelectronic techniques, and it may be difficult to fabricate the input-output components integrally. Separate fabrication of the SQUID base by layup and the SQUID by microelectronic techniques, and then joining the two, is therefore preferred.

Other features and advantages of the present invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENTS

Figure 1:
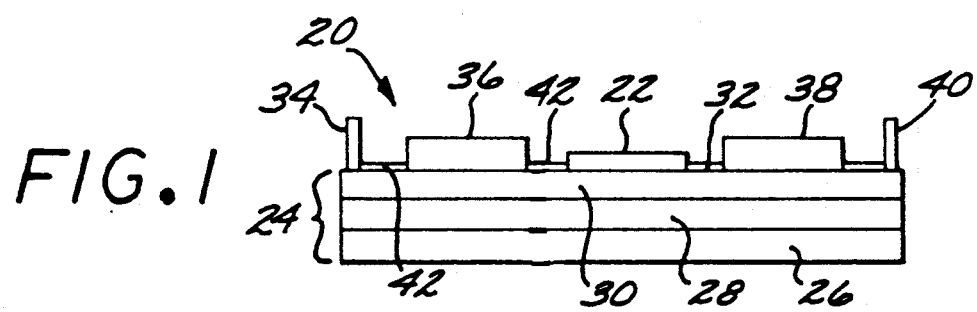
FIG. 1 is a side elevational view of a packaged SQUID system.

FIG. 1 depicts a packaged SQUID system 20 in accordance with a preferred embodiment of the invention. The packaged SQUID system 20 includes a SQUID 22, which is an acronym used throughout the industry for a Superconducting QUantum Interference Device, supported on a SQUID base 24. (The drawings of FIGS. 1-4 are not to scale, but are generally exaggerated as to the thickness of layers so that the interrelation of the layers and the devices can be illustrated more clearly.)

The preparation of SQUIDs in thin film form, as well as non-thin film form, is well known in the art. See, for example, U.S. Pat. No. 4,761,611, whose disclosure is incorporated by reference. A SQUID can be constructed to be operable at a preselected operating temperature. A SQUID has one or a pair of Josephson junctions connected in a loop of material that is superconducting at a preselected operating temperature. For example, in one common and presently preferred form of construction, the loop is made of niobium, which becomes superconducting below about 9.2K, and the preselected temperature is 4.2K or below. The boiling point of liquid helium is 4.2K, and therefore the SQUID is cooled by immersion in liquid helium. The SQUID may also be made of materials that become superconducting at higher temperatures, including within the temperature range above 77K generally viewed as the range of high superconducting transition temperatures.

The SQUID base 24 includes three layers. A first substrate layer 26 is made of an electrically insulating material such as quartz-epoxy composite. The layer 26 is typically from about 1 millimeter to about 3 millimeters thick, preferably about 1.5 millimeters thick, but there are no limitations on its thickness. The first substrate layer 26 can be conveniently fabricated by conventional composite layup procedures well known in the art.

Overlying and fixed to the first substrate layer 26 is a shielding layer 28 made of a material that is superconducting at the preselected operating temperature of the SQUID 22. In the preferred approach, the shielding layer 28 is made of the same material as the loop of the SQUID 22, in this case niobium metal. The shielding layer 28 is typically from about 25 micrometers to about 125 micrometers thick, preferably about 50 micrometers thick. The layer 28 must have a thickness greater than the penetration depth of the superconducting material used in the layer 28. The shielding layer 28 may be attached to the layer 26 by epoxy bonding.

The shielding layer 28 excludes magnetic fields by the Meissner effect, which is known for superconductors and is the basis for conventional magnetic field shielding of SQUIDs. The SQUID is shielded from electromagnetic fields by an effect similar to that realized in the very high frequency limit of eddy current shielding for normal conductors. The shielding factor is roughly $6r/R$, where $r$ is the distance of the SQUID from the shielding layer 28 and $R$ is the distance of a dipole source of interference from the layer 28. In addition to shielding the SQUID and related components from external magnetic and electrical fields, the shielding layer also acts as a magnetic ground plane that reduces the self inductance of the signal traces and loops that they may create, in the final assembled device.

Overlying and fixed to the shielding layer 28 is a second substrate layer 30 made of an electrically insulating material. In the preferred approach, the layer 30 is made of the same material as the first substrate layer 26, in this case quartz-epoxy composite material. The layer 30 is typically from about 0.01 millimeter to about 0.5 millimeter thick, preferably about 0.05 millimeter thick, but there are no limitations on its thickness. The second substrate layer 30 can be conveniently bonded to the shielding layer 28 by epoxy bonding.

The SQUID 22 is supported on an upper surface 32 of the second substrate layer 30. The SQUID 22 is preferably manufactured separately as an integral component and then affixed to the upper surface of the layer 30 by epoxy bonding. Techniques for preparing thin film SQUIDs such as a SQUID 22 are well known in the art and are described, for example, U.S. Pat. No. 4,761,611.

The shielding layer 28 shields the SQUID 22 from external extraneous signals such as magnetic fields and electrical fields that can otherwise interfere with its performance. Previously, the required shielding was prepared by separated fabricating shields of the superconducting materials, as by machining, grinding, etc., a process that is time-consuming and laborious. The SQUID and related components were assembled to the shielding by techniques that made repair difficult. The present approach provides an integral packaged SQUID system that is much less expensive to produce and is easier to repair.

Figure 2:
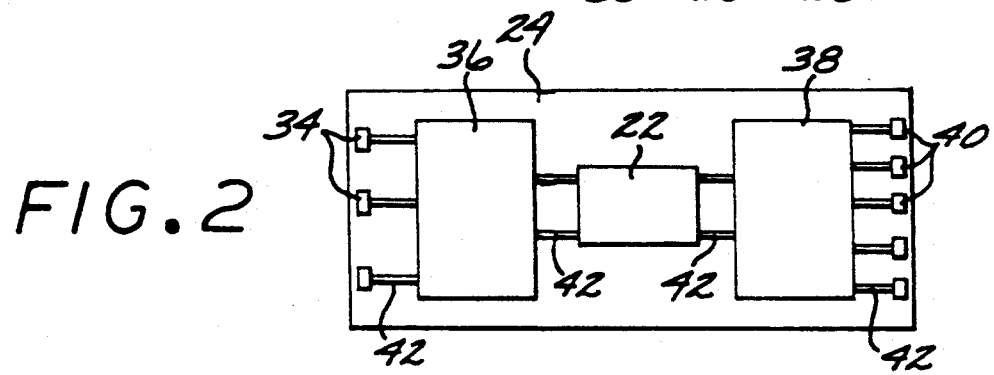
FIG. 2 is a top plan view of the packaged SQUID system of FIG. 1.

The approach of the invention is desirably used to fabricate the packaged SQUID system with related input and output components on the same SQUID base 24 as the SQUID 22, and FIGS. 1-2 illustrate one such preferred form. In this case, input connectors (from the input coil) 34, an input network 36, an output network 38, and output connectors 40 are also affixed to the base 24, or deposited as thin film devices and structure. The various devices and structures are interconnected as necessary with thin film superconducting traces 42 deposited upon the upper surface 32 of the base 24, and preferably made of the same material as the shielding layer 28 so that they are superconducting at the preselected operating temperature of the SQUID 22. The structure of these various components are known in the art, see for example U.S. Pat. Nos. 4,386,361 and 4,389,612, and the publication "Ultra-low-noise tunnel junction dc SQUID with a tightly coupled planar input coil" by M.B. Ketchen and J.M. Jaycox, Appl. Phys. Lett. 40(8), pages 736-738, Apr. 15, 1982, whose disclosures are incorporated by reference. The shielding layer 28 also protects all of these devices and structure from extraneous electrical and magnetic fields. In this embodiment, the input coil of the SQUID 22 is provided elsewhere, and connected to the packaged SQUID system 20 through the input connectors 34.

In accordance with another embodiment of the invention, a packaged SQUID system operable at a preselected operating temperature comprises a layered SQUID base, including a first substrate layer made of an electrically insulating material, a shielding layer overlying at least a portion of the first substrate layer, the shielding layer being made of a material that is superconducting at the preselected operating temperature, and a second substrate layer overlying the shielding layer, the second substrate layer being made of an electrically insulating material; and a SQUID supported upon the SQUID base above the shielding layer.

Figure 3:
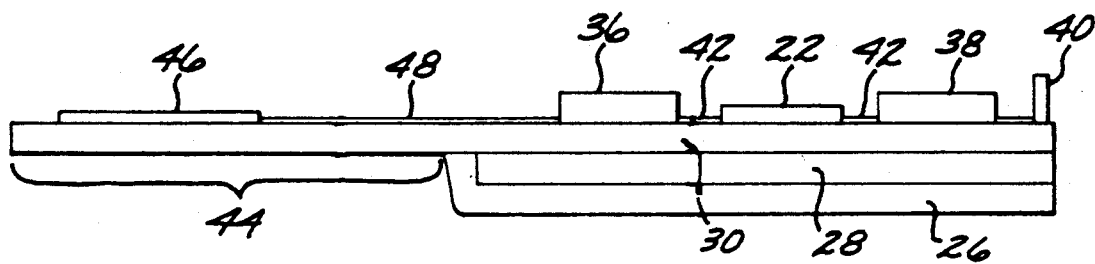
FIG. 3 is a side elevational view of a packaged SQUID system with an integral input coil.
Figure 4:
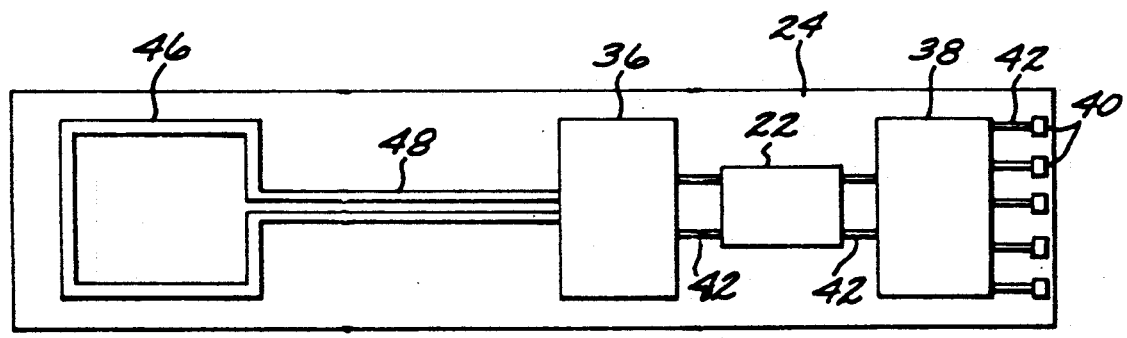
FIG. 4 is a top plan view of the packaged SQUID system of FIG. 3.

In this embodiment, depicted in FIGS. 3-4, one of the substrate layers, here the second substrate layer 30, is extended in size beyond the extend of the shielding layer 28, leaving an unshielded portion 44 of the upper surface 32 that does not overlie the shielding layer 28 and is therefore not protected against external magnetic and electrical fields. (In FIGS. 3 and 4, structures corresponding to those of FIGS. 1 and 2 are identically numbered, and the description of those structures is incorporated into the description of this embodiment.)

With this embodiment, an input coil 46 is deposited upon the unshielded portion 44 of the upper surface 32 of the SQUID base 24. Input coil connector traces 48 extend from the input coil 46 to the input network 36, replacing the input connectors 34 of the previously described embodiment. The input coil 46 and the traces 48 are preferably made of the same material and thickness as the interconnection traces 42, and are deposited upon the upper surface 32 at the same time as the traces 42, by extending the patterning of the deposited layer into the unshielded portion 44. Of course, it is intentional that the input coil 46 not be shielded from the external magnetic fields, as the input coil 46 senses such fields by producing a small electric current in the input coil traces 48 when magnetic flux penetrates the coil 46. The SQUID then detects the small electrical currents, resulting in a measurable indication of the presence of small magnetic fields.

Although particular embodiments of the invention have been described in detail for purposes of illustration, various modifications may be made without departing from the spirit and scope of the invention. Accordingly, the invention is not to be limited except as by the appended claims.

What is claimed is:

1. A packaged SQUID system operable at a preselected operating temperature, comprising:
   a layered SQUID base, including
   a first substrate layer made of an electrically insulating material,
   a shielding layer overlying the first substrate layer, the shielding layer being made of a material that is superconducting at the preselected operating temperature, and
   a second substrate layer overlying the shielding layer, the second substrate layer being made of an electrically insulating material; and
   a SQUID supported upon the SQUID base, the shielding layer extending beneath the entire SQUID.

2. The SQUID system of claim 1, wherein the first substrate layer and the second substrate layer are made of quartz-epoxy composite material.

3. The SQUID system of claim 1, wherein the shielding layer is made of niobium.

4. The SQUID system of claim 1, wherein the shielding layer is from about 25 to about 125 micrometers thick.

5. A packaged SQUID system operable at a preselected operating temperature, comprising:
   a layered SQUID base, including
   a first substrate layer made of an electrically insulating material,
   a shielding layer overlying at least a portion of the first substrate layer, the shielding layer being made of a material that is superconducting at the preselected operating temperature, and
   a second substrate layer overlying the shielding layer, the second substrate layer being made of an electrically insulating material; and
   a SQUID supported upon the SQUID base above the shielding layer, the shielding layer extending beneath the entire SQUID.

6. The SQUID system of claim 5, further including an input connector supported on the SQUID base.

7. The SQUID system of claim 5, further including an input network mounted on the SQUID base.

8. The SQUID system of claim 5, further including an output network mounted on the SQUID base.

9. The SQUID system of claim 5, further including an output connector supported on the SQUID base.

10. A packaged SQUID system operable at a preselected operating temperature, comprising:
    a layered SQUID base, including
    a first substrate layer made of an electrically insulating material,
    a shielding layer overlying at least a portion of the first substrate layer, the shielding layer being made of a material that is superconducting at the preselected operating temperature, and
    a second substrate layer overlying the shielding layer, the second substrate layer being made of an electrically insulating material;
    a SQUID supported upon the SQUID base above the shielding layer, the shielding layer extending beneath the entire SQUID; and
    an input coil separate from, but connected to, the SQUID, mounted on the SQUID base but not over the shielding layer.

11. The SQUID system of claim 1, further including an input coil connected to the SQUID.

12. The SQUID system of claim 5, further including an input coil connected to the SQUID.

* * * * *